(12) United States Patent
Fan et al.

(10) Patent No.: US 9,640,403 B2
(45) Date of Patent: May 2, 2017

(54) LOW ELECTRIC FIELD SOURCE ERASABLE NON-VOLATILE MEMORY AND METHODS FOR PRODUCING SAME

(71) Applicant: Xinnova Technology Limited, Beijing (CN)

(72) Inventors: Der-Tsyr Fan, Beijing (CN); Chih-Ming Chen, Beijing (CN); Jung-Chang Lu, Beijing (CN)

(73) Assignee: Xinnova Technology Ltd., Beijing (CN)

( * ) Notice: Subject to any disclaimer, the term of this patent is extended or adjusted under 35 U.S.C. 154(b) by 204 days.

(21) Appl. No.: 14/599,370

(22) Filed: Jan. 16, 2015

(65) Prior Publication Data

US 2015/0243795 A1     Aug. 27, 2015

(30) Foreign Application Priority Data

Feb. 25, 2014 (CN) .......................... 2014 1 0064641

(51) Int. Cl.

| | |
|---|---|
| H01L 21/28 | (2006.01) |
| H01L 29/423 | (2006.01) |
| H01L 29/66 | (2006.01) |
| H01L 29/788 | (2006.01) |
| H01L 27/11521 | (2017.01) |
| H01L 21/265 | (2006.01) |
| H01L 21/308 | (2006.01) |

(52) U.S. Cl.
CPC .. *H01L 21/28273* (2013.01); *H01L 27/11521* (2013.01); *H01L 29/42328* (2013.01); *H01L 29/66825* (2013.01); *H01L 29/7883* (2013.01); *H01L 29/7889* (2013.01); *H01L 21/2652* (2013.01); *H01L 21/3086* (2013.01)

(58) Field of Classification Search
None
See application file for complete search history.

(56) References Cited

U.S. PATENT DOCUMENTS

| | | | |
|---|---|---|---|
| 6,621,115 B2* | 9/2003 | Jenq et al. | ...................... 257/314 |
| 7,407,857 B2* | 8/2008 | Jeno | ................... H01L 21/28273 |
| | | | 257/E21.209 |
| 2006/0121674 A1* | 6/2006 | Jeno | ................... H01L 21/28273 |
| | | | 438/257 |

* cited by examiner

*Primary Examiner* — Yu Chen
*Assistant Examiner* — Nilufa Rahim
(74) *Attorney, Agent, or Firm* — Wang Law Firm, Inc.

(57) ABSTRACT

A low electric field source erasable non-volatile memory unit includes a substrate having a source diffusion region and a drain diffusion region. The source diffusion region includes a heavily-doped region and a lightly-doped region extending. A first dielectric layer and a tunnel dielectric layer are formed on the substrate. The tunnel dielectric layer includes a lower face contiguous to or partially overlapped with the lightly-doped region of the source diffusion region. A select gate and a floating gate are respectively formed on the first dielectric layer and the tunnel dielectric layer. The floating gate includes a source side edge contiguous to or partially overlapped with the lightly-doped region and misaligned from the heavily-doped region by a distance. A second dielectric layer and a control gate are formed on the floating gate. The control gate and the floating gate are insulating to each other by the second dielectric layer.

15 Claims, 12 Drawing Sheets

LOW ELECTRIC FIELD SOURCE ERASABLE NON-VOLATILE MEMORY AND METHODS FOR PRODUCING SAME

BACKGROUND OF THE INVENTION

The present invention relates to a structure of an integrated circuit component and its producing methods and, more particularly, to a low electric field source erasable non-volatile memory and methods for producing the low electric field source erasable non-volatile memory.

Non-volatile memories have advantages of small volumes, light weights, low power consumption, and prevention of loss of data resulting from power interruption and are, thus, suitable for applications in hand-held electronic devices. Following the popularization of hand-held electronic devices, non-volatile memories have widely been used as multimedia storage devices or used for maintaining normal operation of electronic systems. The need of non-volatile memories increases every year, and the costs and prices decrease, which is a positive cycle for non-volatile memories. Thus, non-volatile memories have become one of the most important products in the semiconductor industry.

U.S. Pat. No. 4,698,787 discloses an erasable non-volatile memory unit of a stack-gate non-volatile memory structure including a floating gate. When the memory undergoes an operation of writing "1", a sufficient amount of electrons is trapped in the floating gate by hot-electron injection, such that the status of the memory unit is "1". When the memory undergoes an operation of writing "0" or erasing, electrons are removed from the floating gate by Fowler-Nordheim tunneling, such that the status of the memory unit is "0". Since the status of the memory unit depends on whether a sufficient amount of electrons is trapped in the floating gate, the status of the memory unit can be maintained even if the power source is removed and is, thus, referred to as a non-volatile memory.

However, the stack-gate non-volatile memory still has the following disadvantages. Firstly, an over erasure effect exists. When the memory unit undergoes the erasing operation, excessive electrons could be removed from the floating gate, resulting in a negative threshold voltage of an equivalent transistor component in the memory unit; namely, the memory unit is normally in a conductive state that leads to unnecessary leakage current. Secondly, a larger operating current is required during the erasing operation. When the memory undergoes the erasing operation, the source voltage is much larger than the voltage of the floating gate and, thus, results in a gate-induced drain leakage (GIDL) effect, leading to leakage current from the source to the substrate. As a result, an external power source more powerful in providing current is required in the operation, leading to difficulties in integration of the whole circuit. Furthermore, to reduce the extent of leakage, the source is in the form of a lightly-doped drain structure. However, as the processes are more and more advanced and the size becomes smaller and smaller, the lightly-doped drain is apt to cause a punch-through effect. Thus, when a stack-gate non-volatile memory is produced by a process for less than 0.2 μm technology node, the lightly-doped drain structure is replaced by a deep N-well to isolate the source from the substrate to avoid leakage. However, in a memory matrix comprised of stack-gate non-volatile memories, a plurality of memory units shares the deep N-well to save the area. Due to the structural limitation, the memory units sharing the deep N-well must simultaneously undergo the erasing operation, which sacrifices the operational flexibility of the circuit. Lastly, during writing of "1", the tunneling probability of electrons is low, because the electric field of the channel is stronger. Thus, a stronger current is required in the operation for increasing the operating speed.

U.S. Pat. No. 5,338,952 and U.S. Pat. No. 5,414,286 disclose a split-gate non-volatile memory. As shown in FIG. 1, in comparison with the above conventional technique, the split-gate non-volatile memory has an additional select gate. Since conduction of the channel in an equivalent transistor component of the non-volatile memory unit requires a positive voltage at both the floating gate and the select gate to be larger than the threshold voltage, the drawback of normal leakage can be avoided by controlling the voltage of the selective gate. Similar to the above conventional stack-gate technique, in order to reduce the gate-induced drain leakage (GIDL), the heavy/light doping of the source is achieved by a diffusing structure of a lightly-doped drain, such that both the gradual heavily-doped region and the lightly-doped region of the source diffuse and are formed below the floating gate to reduce the horizontal electric field of the source, thereby reducing the vertical electric field between the source and the floating gate and thereby reducing the GIDL. However, as the processes are more and more advanced and the size becomes smaller and smaller, the lightly-doped drain is apt to cause a punch-through effect. Thus, the chip has a larger area if the stack-gate non-volatile memory is produced by a process for less than 0.2 μm technology node.

U.S. Pat. No. 7,009,144, U.S. Pat. No. 7,199,424, and U.S. Pat. No. 7,407,857 also disclose a split-gate non-volatile memory structure in which a stepped structure is provided at a bottom of the floating gate. As shown in FIG. 2, in comparison with the conventional technique of the above split-gate non-volatile memory, although the wedge structure cannot completely avoid the GIDL during the erasing operation, the source of the wedge structure extends to the thicker area of the stepped structure of tunnel oxidation layer. Thus, the vertical electric field between the floating gate and the source can greatly be reduced to reduce the GIDL. However, during conduction of an equivalent transistor component of the non-volatile memory unit, the magnitude of the conduction current is decided by a thicker gate dielectric layer formed by the wedge structure, such that the change in the conduction current is larger and, thus, adversely affects the yield of the memories. Furthermore, the thicker tunnel dielectric layer of the stepped floating gate is liable to cause a short circuit between the drain and the source, resulting in great limitation to further miniaturization of the structure.

BRIEF SUMMARY OF THE INVENTION

An objective of the present invention is to overcome the drawbacks of the conventional techniques by providing a low electric field source erasable non-volatile memory unit which can use the erasing operation voltage and the tip voltage effect of the floating gate to avoid electrons from tunneling to the source lightly-doped region while avoiding a high electric field resulting from overlapping of the source heavily-doped region and the floating gate and the resultant GIDL.

The technical solution for achieving the above objective is a low electric field source erasable non-volatile memory unit according to the present invention including:

a substrate including an upper surface, with the substrate further including a source diffusion region and a drain diffusion region, with the source diffusion region including a heavily-doped region and a lightly-doped region extending outwards from the heavily-doped region;

a first dielectric layer formed on the upper surface of the substrate and located on the drain diffusion region side;

a tunnel dielectric layer formed on the upper surface of the substrate and located on the source diffusion region side, with the tunnel dielectric layer including a lower face contiguous to or partially overlapped with the lightly-doped region of the source diffusion region;

a select gate formed on the first dielectric layer;

a floating gate formed on a face of the tunnel dielectric layer, with the floating gate including a source side edge contiguous to or partially overlapped with the lightly-doped region of the source diffusion region and misaligned from the heavily-doped region of the source diffusion region by a distance;

a second dielectric layer formed on a face of the floating gate; and a control gate formed on the face of the floating gate, with the control gate and the floating gate being insulating to each other by the second dielectric layer.

The lightly-doped region of the source diffusion region can be formed on the upper surface of the substrate or formed on a groove portion defined in the upper surface of the substrate or formed on a sidewall of the groove portion. The sidewall of the groove portion is connected to the upper surface of the substrate.

The distance of the floating gate misaligned from the heavily-doped region of the source diffusion region can be in a horizontal direction or a vertical direction.

The first dielectric layer can have a thickness of 0.5-10 nm.

The tunnel dielectric layer can have a thickness of 5-15 nm.

The present invention further provides a method for producing a low electric field source erasable non-volatile memory unit. The method includes:

providing a substrate, with the substrate including an upper surface;

forming a first dielectric layer on the upper surface of the substrate;

forming a select gate on the first dielectric layer;

forming a select gate sidewall insulating layer, and forming a tunnel dielectric layer on the upper surface of the substrate at a location not covered by the select gate;

forming a self-aligned floating gate;

forming a lightly-doped region of a source diffusion region by ion implantation;

forming an ion implantation barrier layer;

forming a heavily-doped region of the source diffusion region by ion implantation;

removing the ion implantation barrier layer;

repairing ion implantation defects by accelerated silicon oxidation and forming a source insulating layer;

forming a second dielectric layer on the floating gate; and forming a control gate on the second dielectric layer.

The heavily-doped region and the lightly-doped region of the source diffusion region can include phosphorus atoms and arsenic atoms having different diffusion coefficients.

The ion implantation barrier layer can have a thickness of 10-30 nm.

The tunnel dielectric layer can have a thickness of 5-15 nm.

The source insulating layer can have a thickness of 10-30 nm.

Furthermore, the present invention provides a method for producing a low electric field source erasable non-volatile memory unit. The method includes:

providing a substrate, with the substrate including an upper surface;

forming a first dielectric layer on the upper surface of the substrate;

forming a select gate on the first dielectric layer;

forming a select gate sidewall insulating layer, and forming a tunnel dielectric layer on the upper surface of the substrate at a location not covered by the select gate;

forming a self-aligned floating gate;

forming a self-aligned groove structure;

forming an ion implantation barrier layer;

forming a heavily-doped region and a lightly-doped region of a source diffusion region by inclined ion implantation and vertical ion implantation;

repairing ion implantation defects by accelerated silicon oxidation and forming a source insulating layer;

removing the ion implantation barrier layer;

filling a portion of the groove structure by a flat insulating layer;

forming a second dielectric layer on the floating gate and the flat insulating layer; and forming a control gate on the second dielectric layer.

The heavily-doped region and the lightly-doped region of the source diffusion region can include phosphorus atoms and arsenic atoms having different diffusion coefficients.

The ion implantation barrier layer can have a thickness of 2-20 nm.

The tunnel dielectric layer can have a thickness of 5-15 nm.

The source insulating layer can have a thickness of 10-30 nm.

In the present invention, under the source erasing operation, since the polycrystalline silicon of the floating gate pointed to the source diffusion region has a tip voltage effect, overlapping of the tip electric field of the floating gate required by the tunneling with the heavily-doped region of the source diffusion region is not so influential. The effects of the low electric field source erasable non-volatile memory unit of the present invention are that since the floating gate only overlaps with the lightly-doped region of the source diffusion region and is misaligned from the heavily-doped region in a horizontal or vertical direction, intensities of the horizontal and vertical electric fields between the source and the p-type silicon substrate can effectively be reduced. Thus, the leakage current from the source diffusion region to the p-type silicon substrate resulting from the GIDL effect can effectively be reduced to reduce the current supply demand of the power source, permitting easy achievement of integration of the whole circuit.

The present invention will become clearer in light of the following detailed description of illustrative embodiments of this invention described in connection with the drawings.

DESCRIPTION OF THE DRAWINGS

FIG. 4b is a diagrammatic view illustrating formation of a tunnel oxidation layer on the structure of FIG. 4a.

FIG. 6b is a diagrammatic view illustrating formation of a tunnel oxidation layer on the structure of FIG. 6a.

Figure 1:
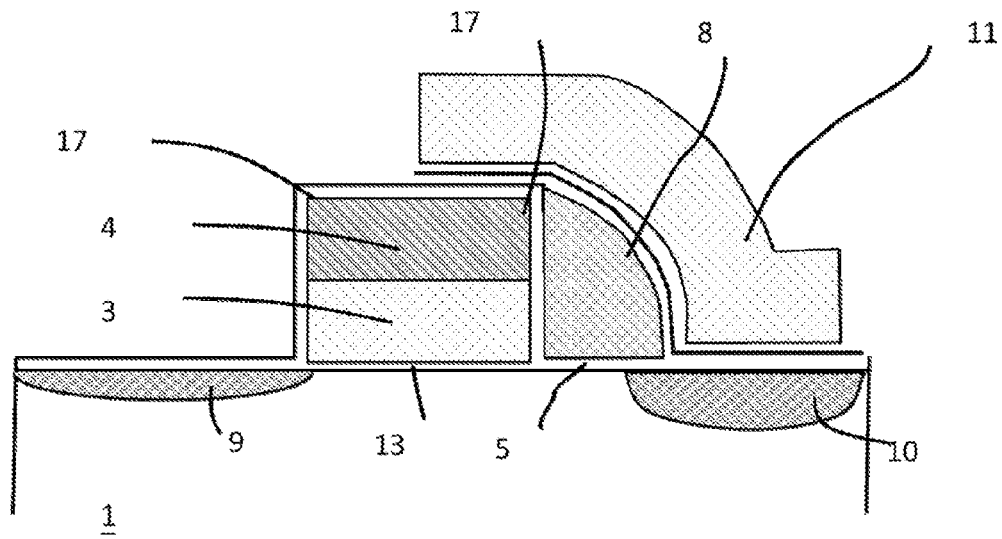
FIG. 1 is a diagrammatic cross sectional view of a conventional non-volatile memory.
Figure 2:
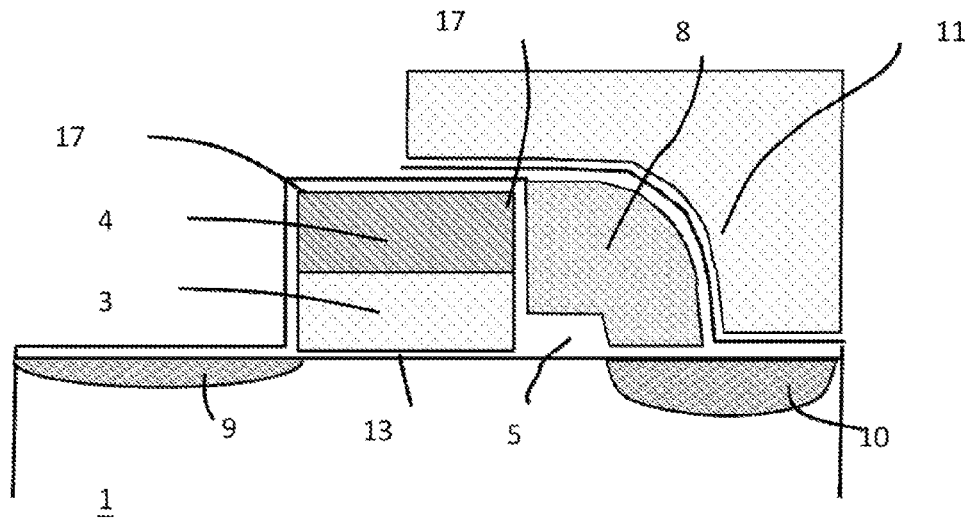
FIG. 2 is a diagrammatic cross sectional view of another conventional non-volatile memory.

REFERENCE NUMBER 1 p-type substrate
1a upper surface
2 source groove portion
2a bottom of groove portion
2b sidewall of groove portion
3 select gate
4 first insulating layer
5 tunnel dielectric layer
6 source insulating layer
7 polycrystalline silicon layer
8 floating gate
9 drain diffusion region
10 source diffusion region
11 second dielectric layer
12 control gate
13 first dielectric layer
15 etch blocking layer of silicon nitride
17 composite sidewall insulating layer of silicon dioxide or silicon nitride
18 ion implantation barrier layer of silicon dioxide or silicon nitride

DETAILED DESCRIPTION OF THE INVENTION

The present invention will be further described by way of examples in connection with the accompanying drawings.

The technical terms in the following description are used in reference to the idioms in the art. Some of the terms are explained or defined in the specification, and such explanation or definition in the specification should be based to interpret these terms. Furthermore, on the premise of practicability, the terms "on", "under", "at", etc. used in the specification refers to directly or indirectly "on" or "under" an object or a reference object and directly or indirectly "at" an object or a reference object. The term "indirect" used herein refers to the existence of an intermediate object or a physical space. On the premise of practicability, the terms "contiguous" and "between" used herein refers to two objects or two reference objects between which an intermediate object or a space exists or does not exist. Furthermore, in the following description related to semiconductor processes, the terms common in the semiconductor processing field, such as the techniques of "formation of an oxidation layer", "lithography", "etching", "cleaning", "diffusion", "ion implantation", "chemical and physical vapor deposition", will not be described to avoid redundancy if these terms do not involve the technical features of the present invention. Furthermore, the shape, size, and proportion of the components in the figures are illustrative only and are related to the parameters and processing capability mentioned in the specification to provide ease of understanding of the present invention by a person having ordinary in the art, rather than limiting the embodying scope of the present invention. Furthermore, the producing method mentioned in the specification is merely related to production of a single non-volatile memory unit. In fact, a person having ordinary skill in the art can use conventional techniques to implement an industrially applicable non-volatile memory matrix comprised of a plurality of non-volatile memory units.

Figure 3:
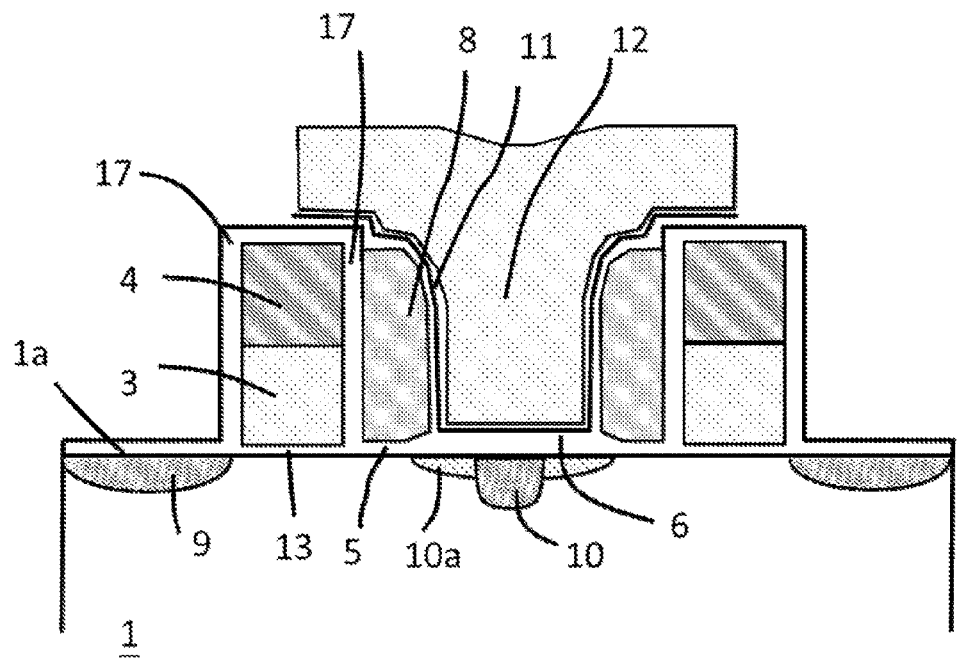
FIG. 3 is a diagrammatic cross sectional view of a low electric field source erasable non-volatile memory unit of a first embodiment according to the present invention.

FIG. 3 is a diagrammatic cross sectional view of a low electric field source erasable non-volatile memory unit of a first embodiment according to the present invention.

Please refer to FIG. 3 showing two low electric field source erasable non-volatile memory units symmetric to each other. Description of the low electric field source erasable non-volatile memory unit at the left part of the figure will be set forth. The low electric field source erasable non-volatile memory unit includes a substrate that is generally a p-type silicon substrate 1. The p-type silicon substrate 1 includes an upper surface 1a. In the p-type silicon substrate 1, a drain diffusion region 9 is formed by an n-type doped layer, and a source diffusion region 10 is formed by another n-type doped layer. The source diffusion region 10 includes a lightly-doped region 10a that is a lightly-doped n-type region (source lightly n-doped diffusion). The drain diffusion region 9 is not contiguous to the source diffusion region 10.

As shown in FIG. 3, the low electric field source erasable non-volatile memory unit further includes a first dielectric layer 13, a tunnel dielectric layer 5, a select gate 3, a first insulating layer 4, a floating gate 8, and a control gate 12.

The first dielectric layer 13 is a gate dielectric layer and is generally an oxidation layer. The first dielectric layer 13 is formed on the upper surface 1a of the p-type silicon substrate 1. A thickness of the first dielectric layer 13 is 0.5-10 nm. The thickness of the first dielectric layer 13 can be equal to the thickness of a dielectric layer of any logic gate.

The tunnel dielectric layer 5 is generally a tunnel insulating layer of silicon dioxide and is formed between the first dielectric layer 13 and the source diffusion region 10. A lower face of the tunnel dielectric layer 5 is contiguous to or partially overlaps with the lightly-doped region 10a of the source diffusion region 10. A thickness of the tunnel dielectric layer 5 is between 5-15 nm, generally 10 nm.

The select gate 3 is formed on the first dielectric layer 13. The first insulating layer 4 is formed on the select gate 3. The floating gate 8 is formed on the tunnel dielectric layer 5. A source side edge of the floating gate 8 is contiguous to or partially overlaps with the lightly-doped region 10a of the source diffusion region 10. The floating gate 8 is spaced from the select gate 3 and the first insulating layer 4 by a sidewall insulating layer 17 (generally a composite layer made of silicon dioxide or made of silicon dioxide and silicon nitride) and is formed on a side of the sidewall insulating layer 17. A thickness of the sidewall insulating layer 17 is 10-30 nm, preferably 20 nm. A second dielectric layer 11 (generally a composite layer made of silicon dioxide and silicon nitride) is formed on the floating gate 8 and the first insulating layer 4. A thickness of the second dielectric layer 11 is 10-20 nm.

The control gate 12 generally has a thickness of 100 nm. At least a portion of the control gate 12 is formed on the floating gate 8. Furthermore, the control gate 12 and the floating gate 8 are insulating to each other by the second dielectric layer 11.

As shown in FIG. 3, the floating gate 8 is electrically insulating and is without electrical connection with the outside. However, by controlling the voltage of the control gate 12, the voltage of the floating gate 8 can indirectly be controlled by capacitor coupling.

Since the floating gate 8 of the low electric field source erasable non-volatile memory unit is located on the lightly-doped region 10a of the source diffusion region 10, when the low electric field source erasable non-volatile memory unit undergoes an erasing operation, the source diffusion region 10 is misaligned from the floating gate 8 in the horizontal direction, such that the vertical electric field at the heavily-doped region of the source diffusion region 10 is greatly reduced. Furthermore, the lightly-doped region 10a of the source diffusion region 10 and the floating gate 8 still efficiently undergo electron tunneling through the tunnel dielectric layer 5 due to tip electric field effect. Thus, the source leakage effect between the floating gate 8 and the p-typed silicon substrate 1 can effectively be reduced to reduce the current supply demand of the power source, permitting easy achievement of integration of the whole circuit.

An example of a method for producing the low electric field source erasable non-volatile memory unit of FIG. 3 will now be set forth.

FIGS. 4a-4i are diagrammatic views illustrating an example of the method for producing the low electric field source erasable non-volatile memory unit disclosed in the present invention, which can be used in production of a low electric field source erasable non-volatile memory unit. This example includes the following steps.

Figure 4A:
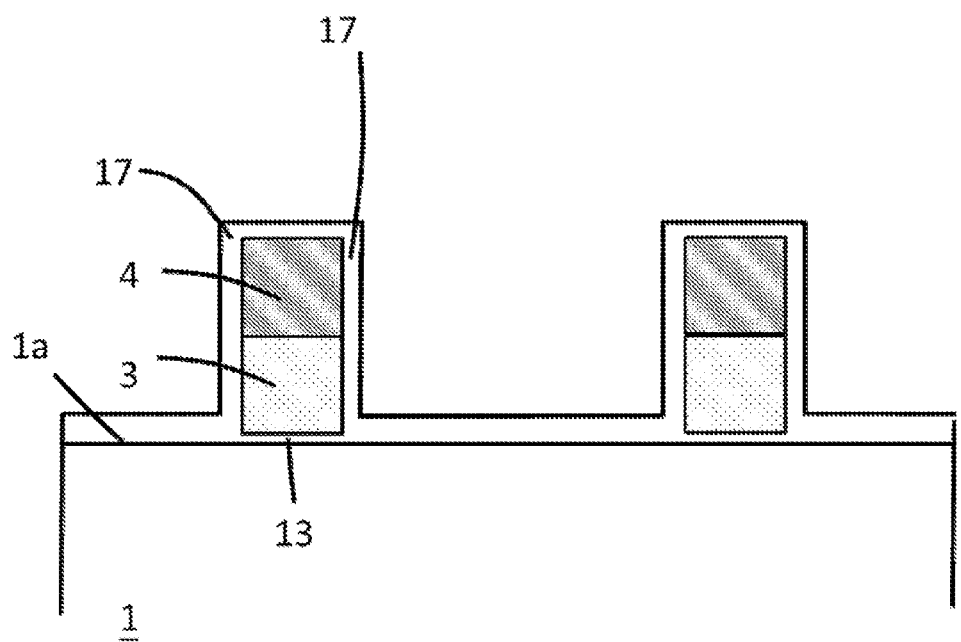
FIG. 4a is a diagrammatic view illustrating formation of a select gate, a first insulating layer, and a sidewall barrier layer by an example of a method for producing a low electric field source erasable non-volatile memory unit of the first embodiment according to the present invention.

As shown in FIG. 4a, a substrate, such as a p-type silicon substrate 1, is prepared. The p-type silicon substrate 1 has an upper surface 1a.

As shown in FIG. 4a, a first dielectric layer 13 is formed on the upper surface 1a of the p-type silicon substrate 1 by thermal oxidation or any other oxidation. The first dielectric layer 13 is generally a gate oxidation layer of silicon dioxide or any other high-k dielectric layer. The first dielectric layer 13 has a thickness of 1-10 nm.

As shown in FIG. 4a, a select gate 3 and a first insulating layer 4 are formed on the first dielectric layer 13. Specifically, a 100 nm polycrystalline silicon layer and a 100 nm insulating layer are formed on the whole face of the first dielectric layer 13 in sequence. The material for the insulating layer can be silicon nitride (SiN) or tetraethyl orthosilicate (TEOS). Next, an etch blocking pattern layer is formed on the insulating layer. After formation of the etch blocking pattern layer, selective etching is carried out to etch away a portion of the polycrystalline silicon layer and the insulating layer to form the select gate 3 and the first insulating layer 4.

As shown in FIG. 4a, the etch blocking pattern layer is removed, and a high-temperature oxide (HTO) deposition process is used to form a $SiO_2$ insulating layer on the whole face of the p-type silicon substrate 1 already having the select gate 3 and the first insulating layer 4. The $SiO_2$ insulating layer can combine with a SiN spacer (10-20 nm) to form a composite layer covering the sidewall faces of the select gate 3 and the first insulating layer 4. The $SiO_2$ insulating layer covers an exposed portion of the $SiO_2$ gate oxidation layer, a side of the select gate 3, and a side of the first insulating layer 4 as well as the top face of the first insulating layer 4. A thickness of the $SiO_2$ insulating layer is 10-30 nm. The $SiO_2$ insulating layer forms a $SiO_2$ layer or the above sidewall insulating layer 17 on the sidewall portions of the select gate 3 and the first insulating layer 4. The cross sectional view of the low electric field source erasable non-volatile memory unit by now is shown in FIG. 4a.

Figure 4B:
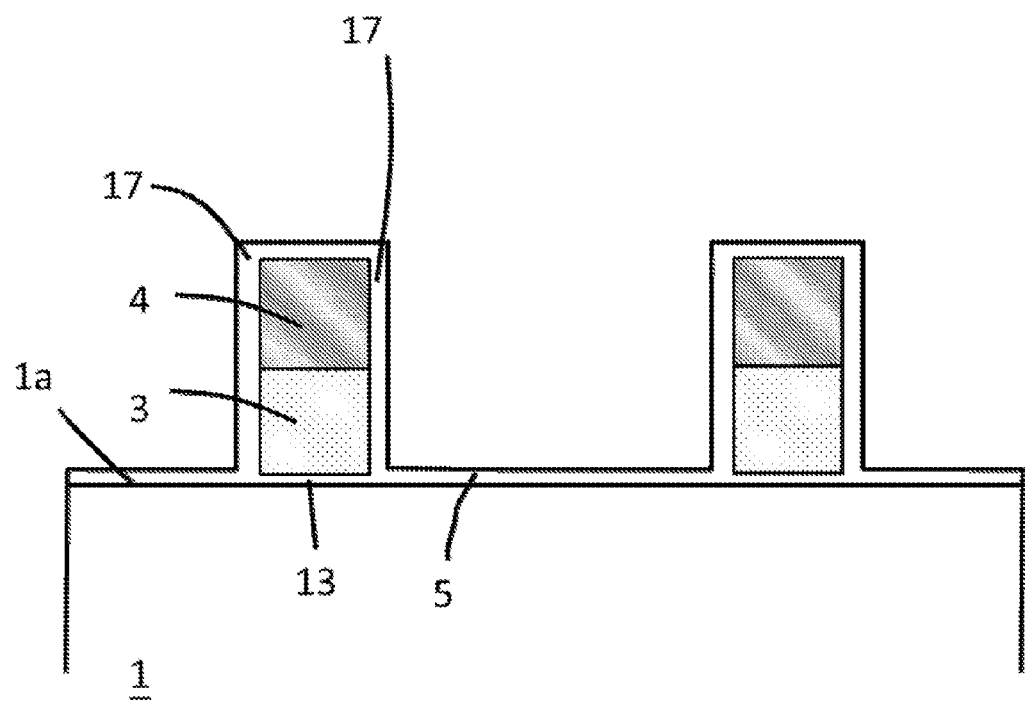

As shown in FIG. 4b, the residual insulating layer on the upper surface 1a of the substrate 1 is then removed. Next, a tunnel dielectric layer 5 is formed on the upper surface 1a of the substrate 1 by thermal oxidation or in situ steam generation (ISSG). The tunnel dielectric layer 5 has a thickness of 5-15 nm.

Figure 4C:
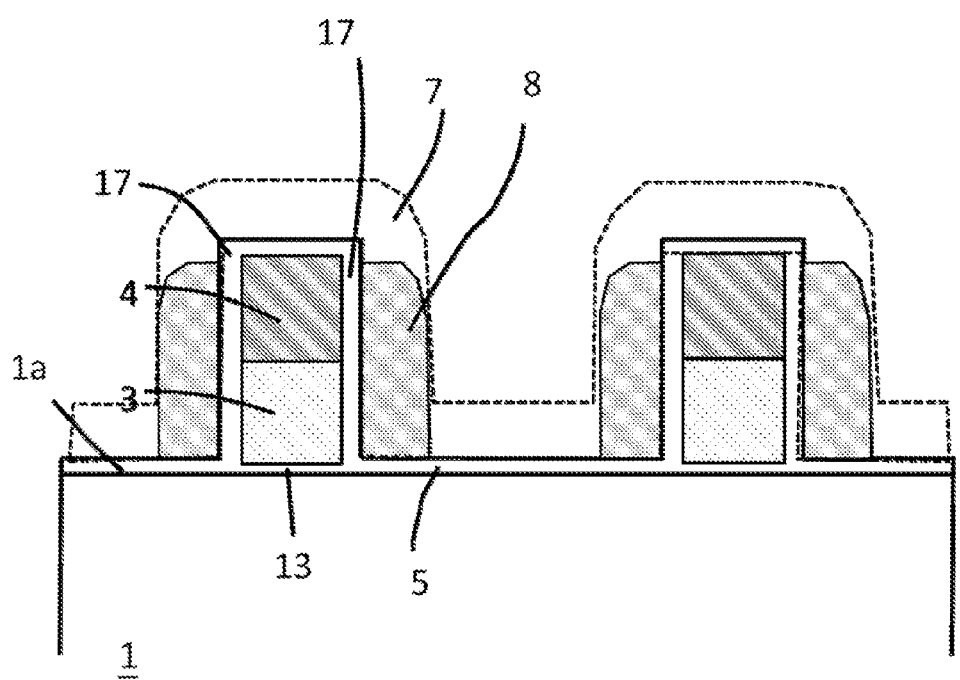
FIG. 4c is a diagrammatic view illustrating formation of a sidewall of a floating gate on the structure of FIG. 4b.

As shown in FIG. 4c, a polycrystalline silicon layer 7 is formed on the face of the structure of FIG. 4b. The polycrystalline silicon layer 7 has a thickness of 20-200 nm, preferably about 100 nm. Reactive ion etching (RIE) is carried out on the polycrystalline silicon layer 7 and is highly directional. Only a portion of the resultant polycrystalline silicon layer 7 at the sides of the select gate 3 and the first insulating layer 4 is left. The cross sectional view of the low electric field source erasable non-volatile memory unit by now is shown in FIG. 4c.

Figure 4D:
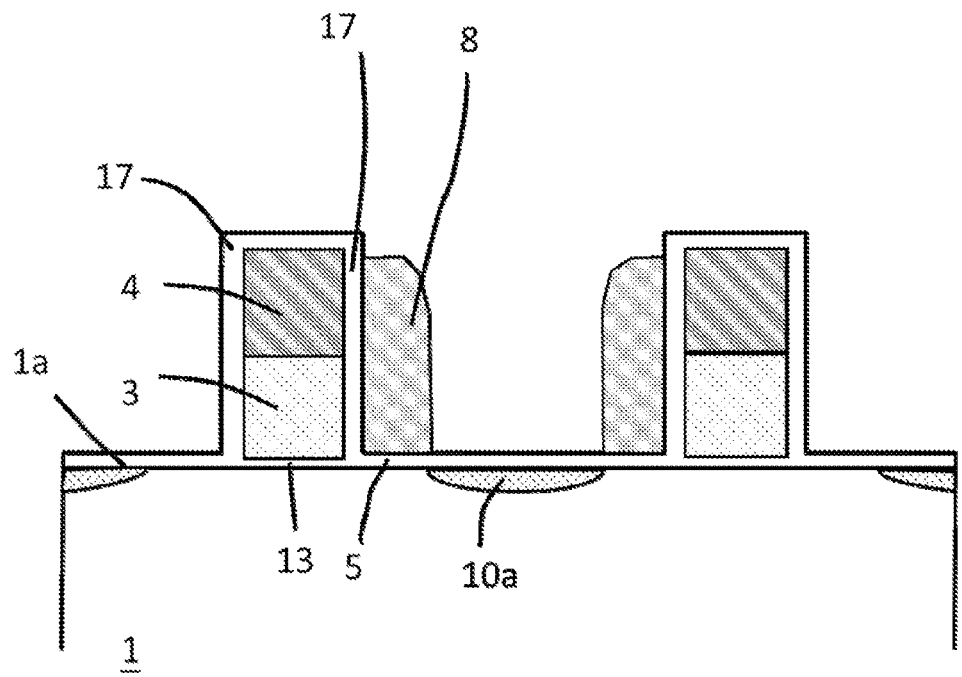
FIG. 4d is a diagrammatic view illustrating formation of the floating gate and a lightly-doped region of a source on the structure of FIG. 4c.

As shown in FIG. 4d, by using implantation, N-type atoms (preferably arsenic atoms or phosphorus atoms) are doped into a side of the select gate 3 and a side of the first insulating layer 4 to form an n-type lightly-doped region 10a. The doping concentration is $10^{12}$-$10^{14}$/cm$^3$. The lightly-doped region 10a can be a gradually doped structure.

Figure 4E:
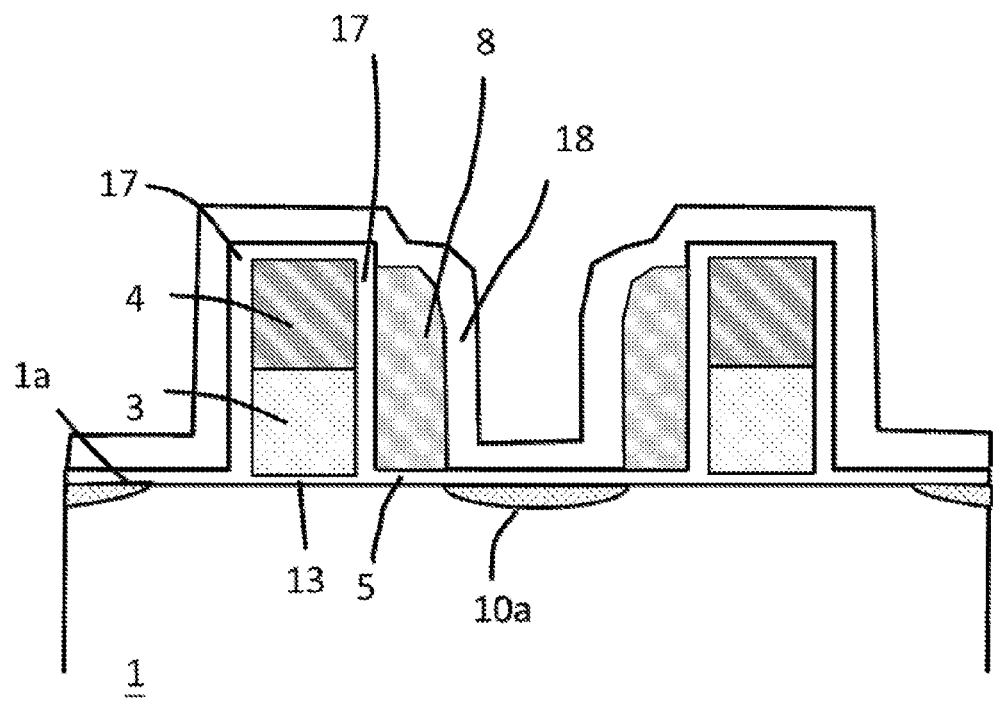
FIG. 4e is a diagrammatic view illustrating formation of an ion implantation insulating layer on the structure of FIG. 4d.

As shown in FIG. 4e, a uniformly covering ion implantation barrier layer 18 is formed. The material for the ion implantation barrier layer 18 can be silicon nitride (SiN) or tetraethyl orthosilicate (TEOS). The ion implantation barrier layer 18 has a thickness of 10-50 nm.

Figure 4F:
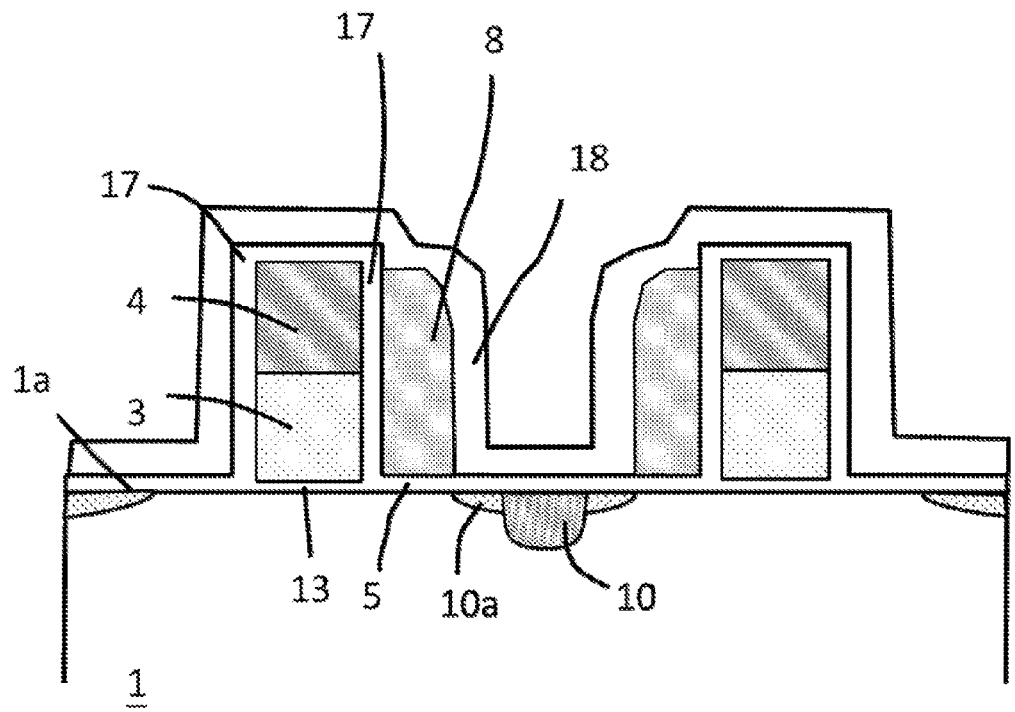
FIG. 4f is a diagrammatic view illustrating formation of a heavily-doped region of the source on the structure of FIG. 4e.

As shown in FIG. 4f, by using implantation, N-type atoms (preferably arsenic atoms) are doped into the lightly-doped region 10a to form an n-type heavily-doped region 10. The doping concentration is $10^{14}$-$10^{16}$/cm$^3$. The cross sectional view of the low electric field source erasable non-volatile memory unit by now is shown in FIG. 4f.

Figure 4G:
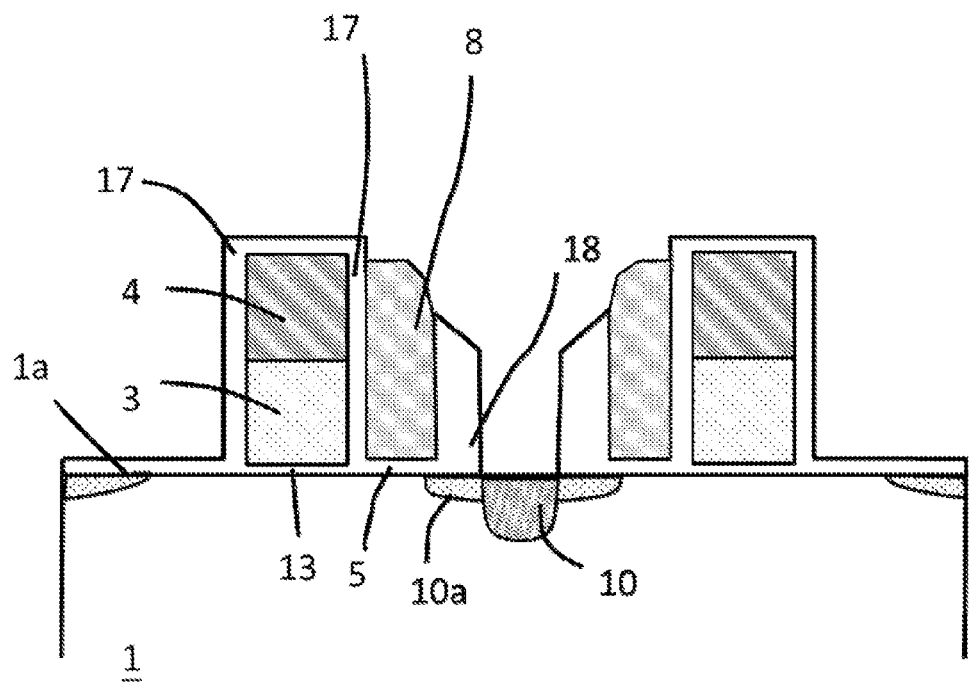
FIG. 4g is a diagrammatic view illustrating formation of the ion implantation insulating layer by another method on the structure of FIG. 4f.

FIG. 4g shows another structure after the source heavy doping. Different from the structure of FIG. 4e, the uniformly covering ion implantation barrier layer 18 is etched back to form a barrier layer sidewall. Removal of the ion implantation barrier layer 18 on the upper face of the lightly-doped region 10a of the source diffusion region 10 is advantageous to processing of low-energy ion implantation, which further reduces the defects resulting from ion implantation and reduces the source impedance.

Figure 4H:
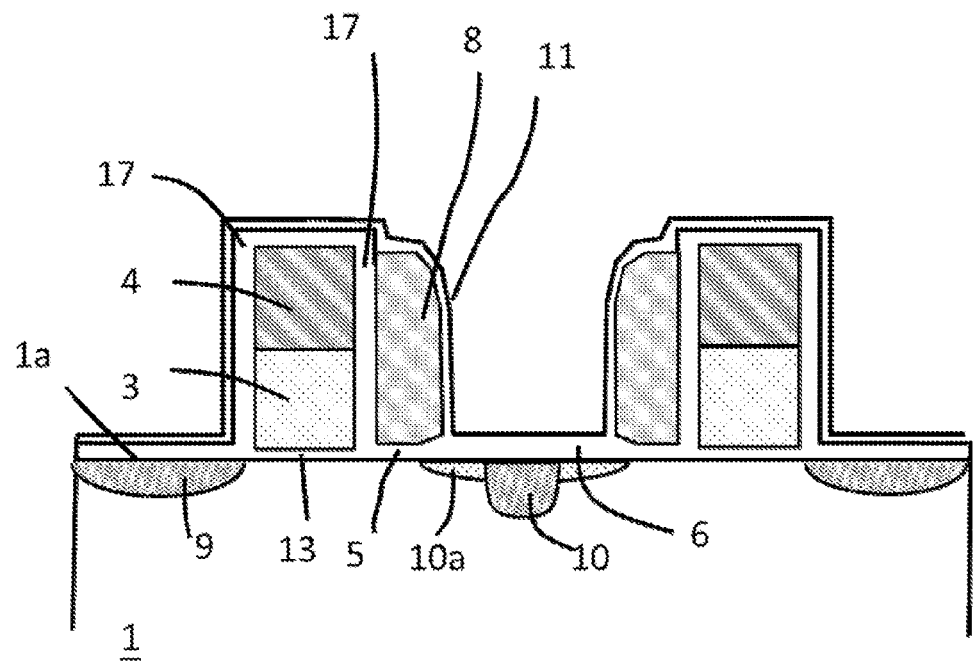
FIG. 4h is a diagrammatic view illustrating formation of a drain and a source oxidation layer on the structure of FIG. 4f or FIG. 4g.

As shown in FIG. 4h, an accelerated oxidation ion implantation repair layer and an oxide/nitride/oxide (ONO) layer are formed on the face where the ion implantation barrier layer 18 has been removed, forming a second dielectric layer 11 having a thickness of 10-20 nm, preferably 15 nm. The accelerated oxidation ion implantation repair layer also forms a thicker source insulating layer 6 on top of the source diffusion layer 10 due to accelerated oxidation.

Figure 4I:
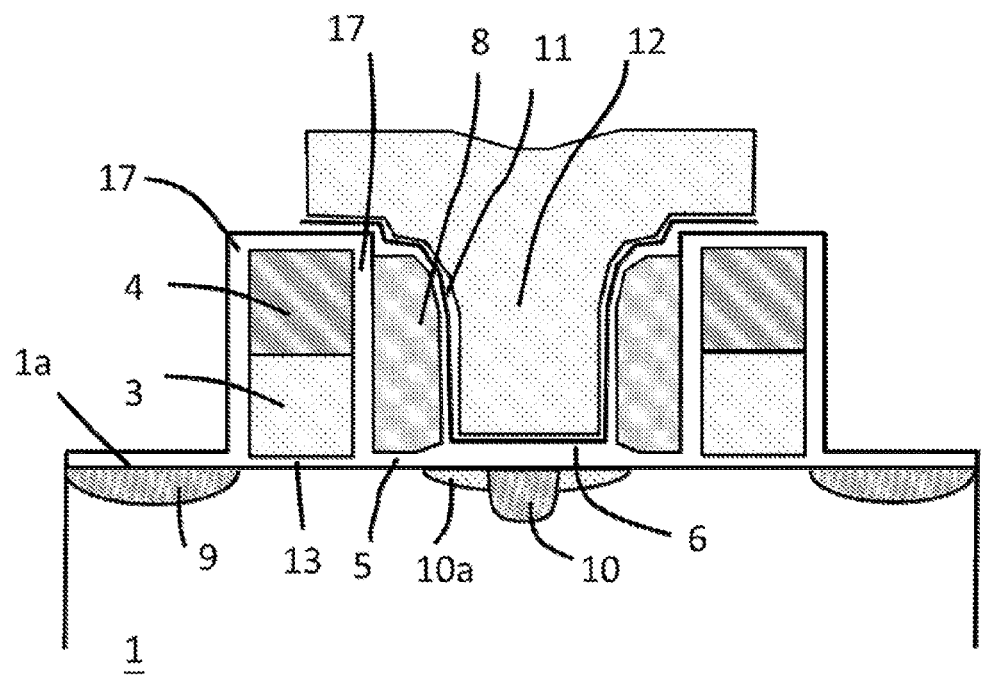
FIG. 4i is a diagrammatic view illustrating formation of a second dielectric layer and a control gate on the structure of FIG. 4h.

As shown in FIG. 4i, a control gate 12 is formed on the second dielectric layer 11. For example, a polycrystalline silicon layer is formed on the whole face of the second dielectric layer 11 and has a thickness of 100 nm. Next, another etch blocking pattern layer is formed, and selective etching is carried out. The remaining polycrystalline silicon layer defines a control gate 12. The control gate 12 mainly covers the floating gate 8. Then, the etch blocking pattern layer is removed. The main structure of the low electric field source erasable non-volatile memory unit is accomplished by now, and its cross sectional view is shown in FIG. 4i which is identical to FIG. 3.

Figure 5:
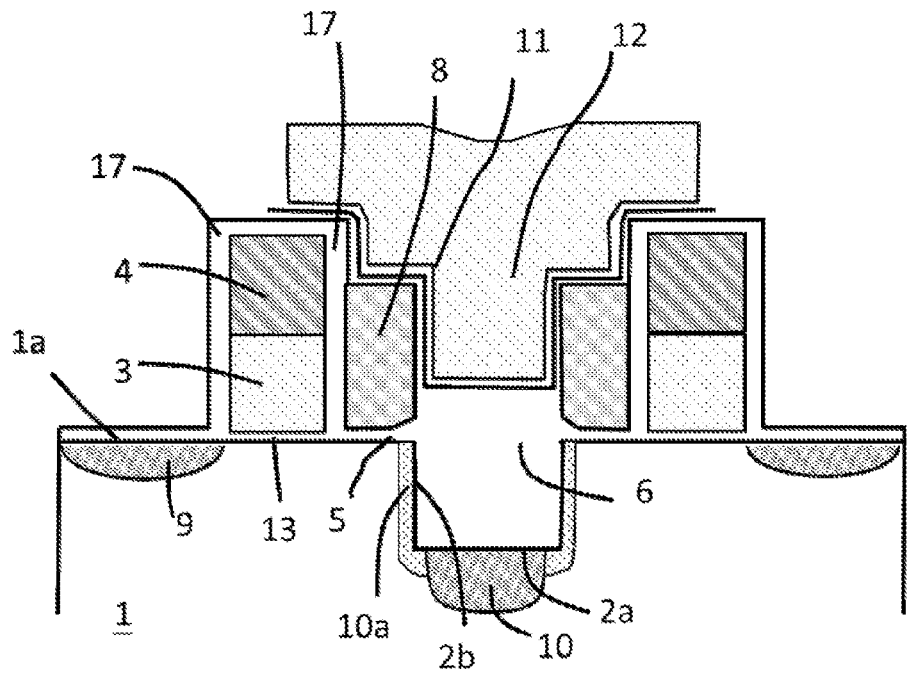
FIG. 5 is a diagrammatic cross sectional view of a low electric field source erasable non-volatile memory unit of a second embodiment according to the present invention.

FIG. 5 is a diagrammatic cross sectional view of a low electric field source erasable non-volatile memory unit of a second embodiment according to the present invention.

An example of the method for producing the low electric field source erasable non-volatile memory unit of the second embodiment will now be set forth in connection with FIGS. 6a-6i.

Figure 6A:
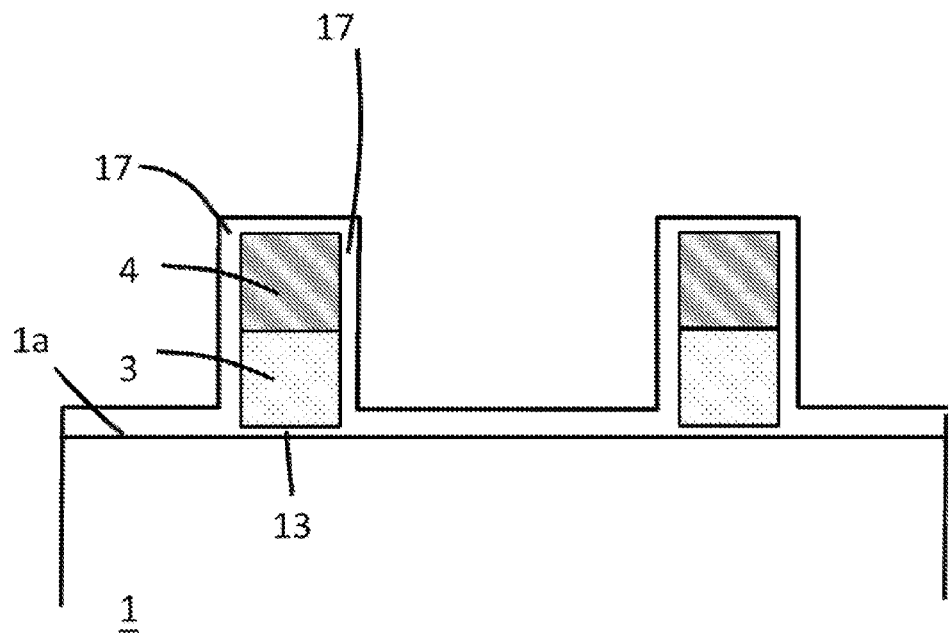
FIG. 6a is a diagrammatic view illustrating formation of a select gate, a first insulating layer, and a sidewall barrier layer by an example of a method for producing a low electric field source erasable non-volatile memory unit of the second embodiment according to the present invention.

The formation step shown in FIG. 6a is the same as that shown in FIG. 4a. Please refer to the corresponding description in connection with FIG. 4a.

Figure 6B:
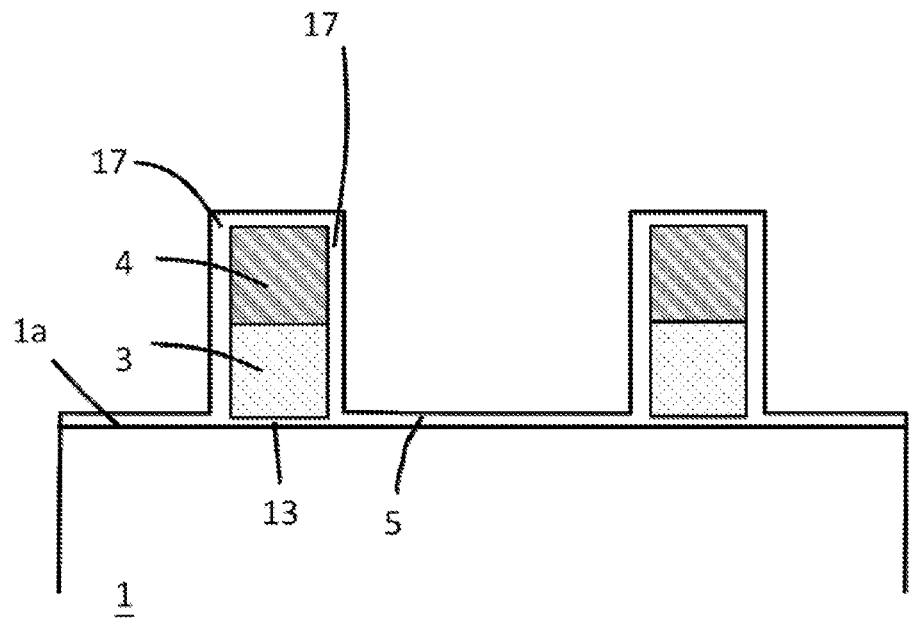

The formation step shown in FIG. 6b is the same as that shown in FIG. 4b. Please refer to the corresponding description in connection with FIG. 4b.

Figure 6C:
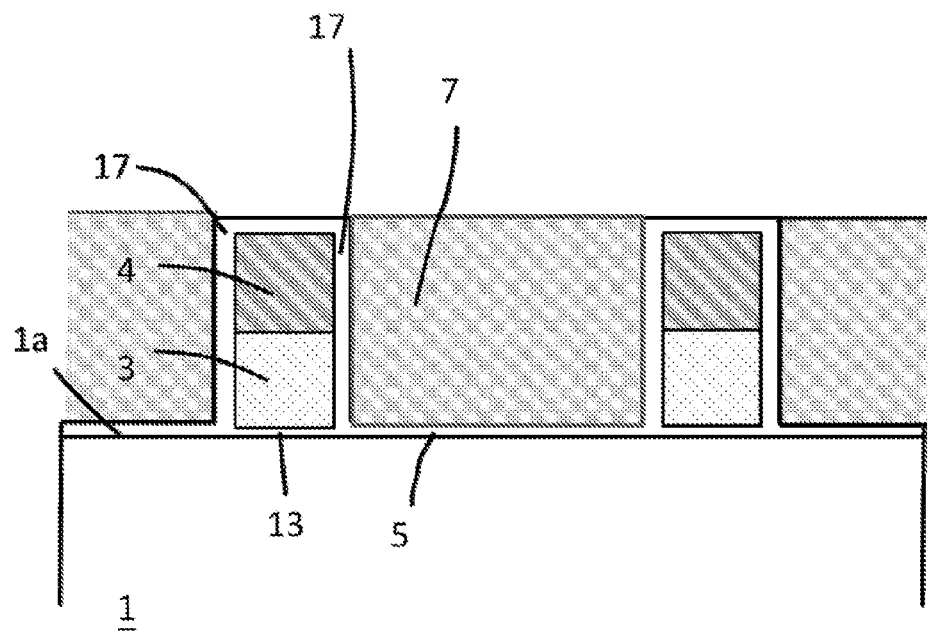
FIG. 6c is a diagrammatic view illustrating formation of a sidewall of a floating gate on the structure of FIG. 6b.

As shown in FIG. 6c, a flat polycrystalline silicon layer 7 is formed on the face of the structure of FIG. 6b by chemical vapor deposition (CVD) and etch back or chemical-mechanical polishing (CMP). The upper face of the polycrystalline silicon layer 7 above the first insulating layer 4 and the floating gate 3 has an equal height.

Figure 6D:
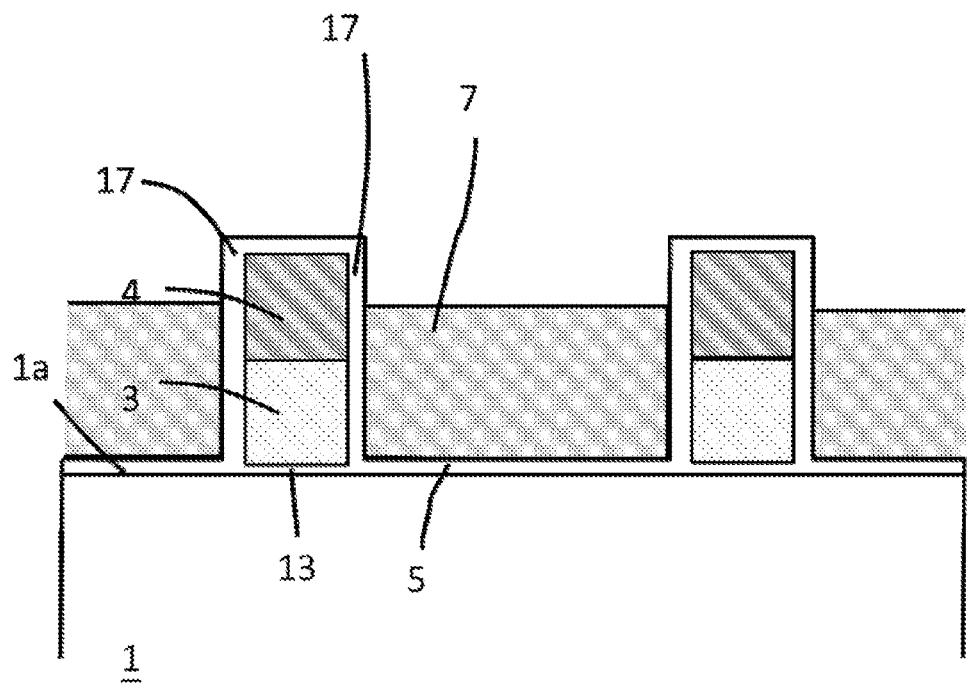
FIG. 6d is a diagrammatic view illustrating formation of a polycrystalline silicon etch back structure of the floating gate on the structure of FIG. 4c.

As shown in FIG. 6d, reactive ion etching (RIE) is carried out on the polycrystalline silicon layer 7 and is highly directional. The resultant polycrystalline silicon layer 7 has a level difference relative to the first insulating layer 4. The level difference is about 20-100 nm, preferably 50 nm. The cross sectional view of the low electric field source erasable non-volatile memory unit by now is shown in FIG. 6d.

Figure 6E:
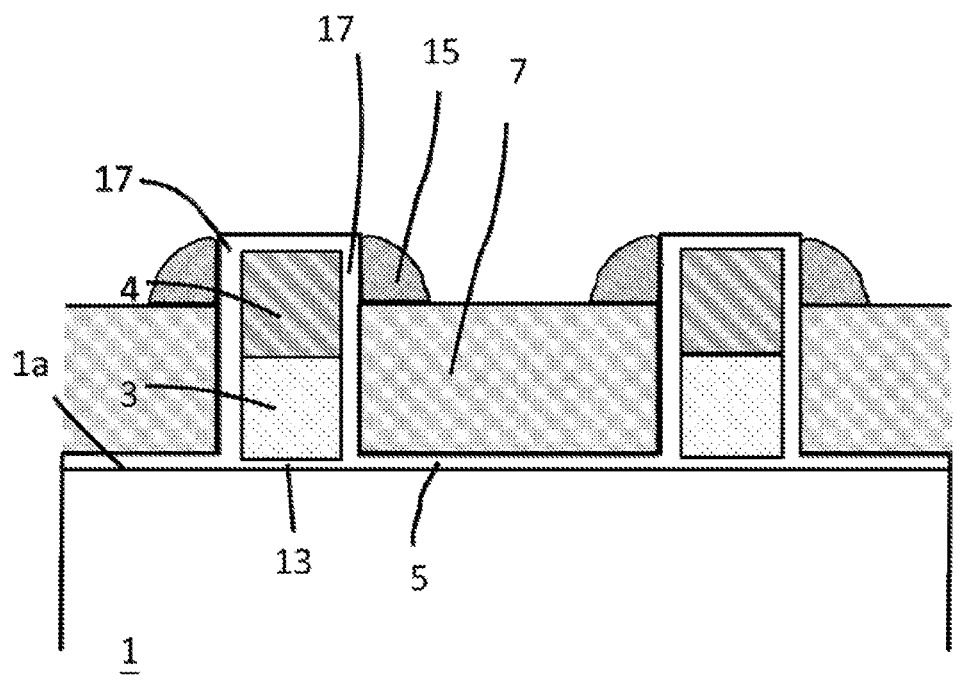
FIG. 6e is a diagrammatic view illustrating formation of a self-aligned etch blocking layer on the structure of FIG. 6d.

As shown in FIG. 6e, a self-aligned etch blocking layer 15 is formed. The etch blocking layer 15 is generally formed of silicon oxide or silicon nitride by chemical deposition.

Figure 6F:
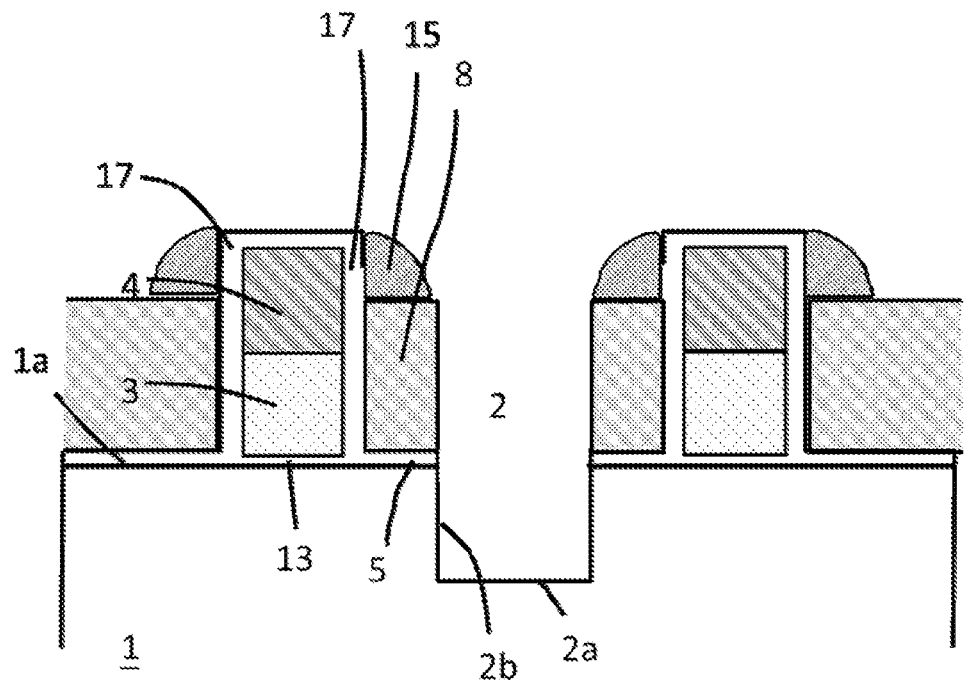
FIG. 6f is a diagrammatic view illustrating formation of a groove portion of the source on the structure of FIG. 6e.

As shown in FIG. 6f, by using the self-aligned etch blocking layer 15 as a mask, reactive ion directional etching is carried out to remove a portion of the polycrystalline silicon layer and a portion of the silicon substrate 1 not covered by the etch blocking layer 15, forming a recessed source groove portion 2. The source groove portion 2 includes a sidewall 2b and a bottom 2a. The etch depth (the depth of the sidewall 2b) of the silicon substrate 1 from the tunnel dielectric layer 5 is about 50-150 nm.

Figure 6G:
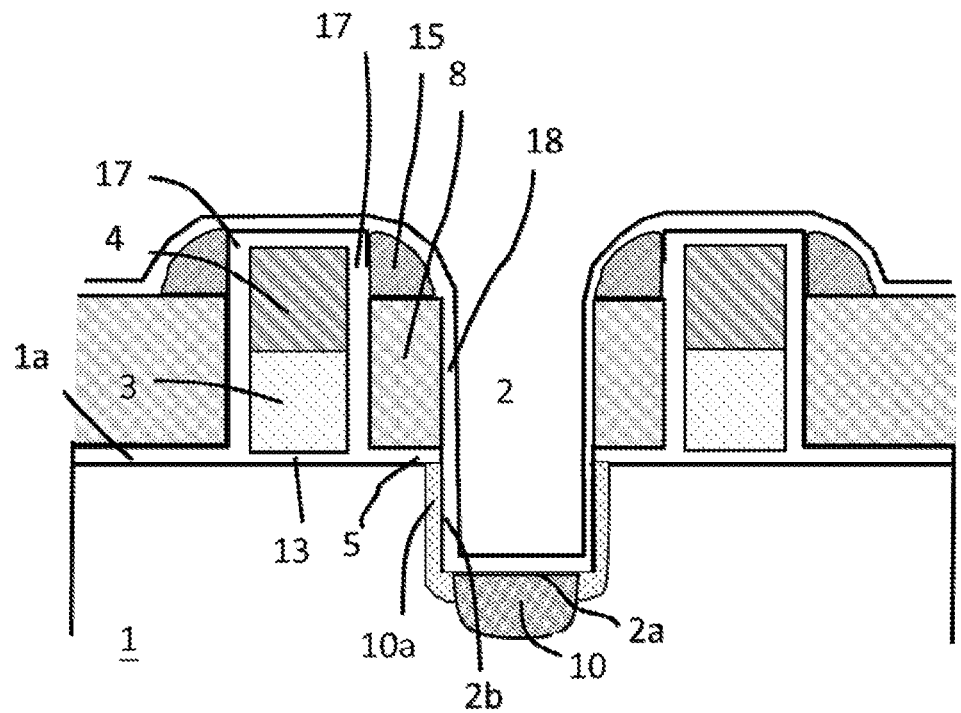
FIG. 6g is a diagrammatic view illustrating formation of a heavily-doped region in the groove portion of the source on the structure of FIG. 6f.

As shown in FIG. 6g, a uniformly covering ion implantation barrier layer 18 is formed. The material for the ion implantation barrier layer 18 can be silicon nitride (SiN) or tetraethyl orthosilicate (TEOS). The ion implantation barrier layer 18 has a thickness of 5-25 nm. By using inclined ion implantation and vertical ion implantation, N-type atoms (generally phosphorus atoms and arsenic atoms) are doped into the recessed source groove portion 2. The doping concentration of the inclined ion implantation is $10^{12}$-$10^{14}$/cm$^3$. The doping concentration of the vertical ion implantation is $10^{14}$-$10^{16}$/cm$^3$. The cross sectional view of the low electric field source erasable non-volatile memory unit by now is shown in FIG. 6g.

Figure 6H:
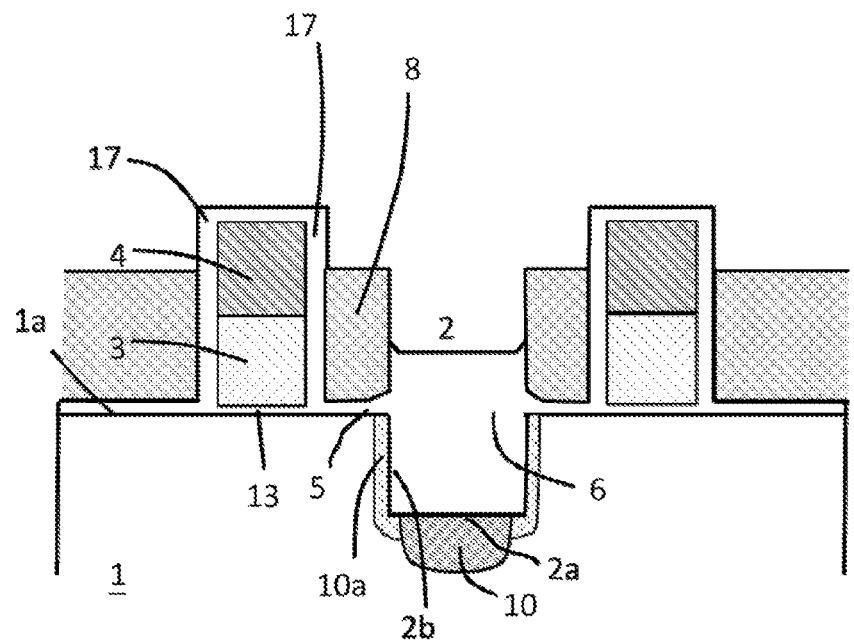
FIG. 6h is a diagrammatic view illustrating formation of a source insulating structure filling a half of the groove portion on the structure of FIG. 6g.

As shown in FIG. 6h, the ion implantation barrier layer 18 is removed, and a flat source insulating layer 6 filling a half of the source groove portion 2 is formed by chemical vapor deposition (CVD) and etch back or chemical-mechanical polishing (CMP). The cross sectional view of the low electric field source erasable non-volatile memory unit by now is shown in FIG. 6h.

Figure 6I:
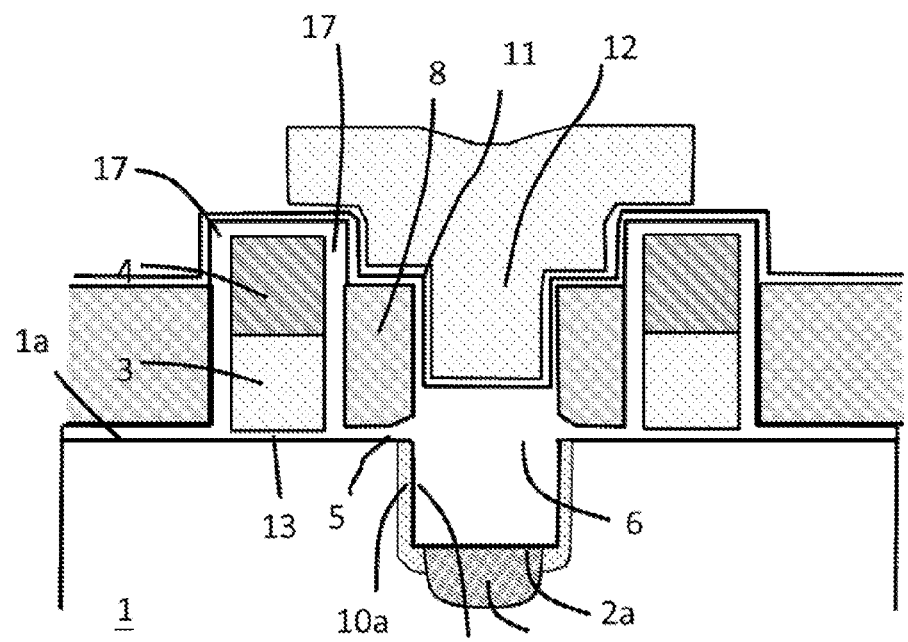
FIG. 6i is a diagrammatic view illustrating formation of a second dielectric layer and a control gate on the structure of FIG. 6h.
Figure 6J:
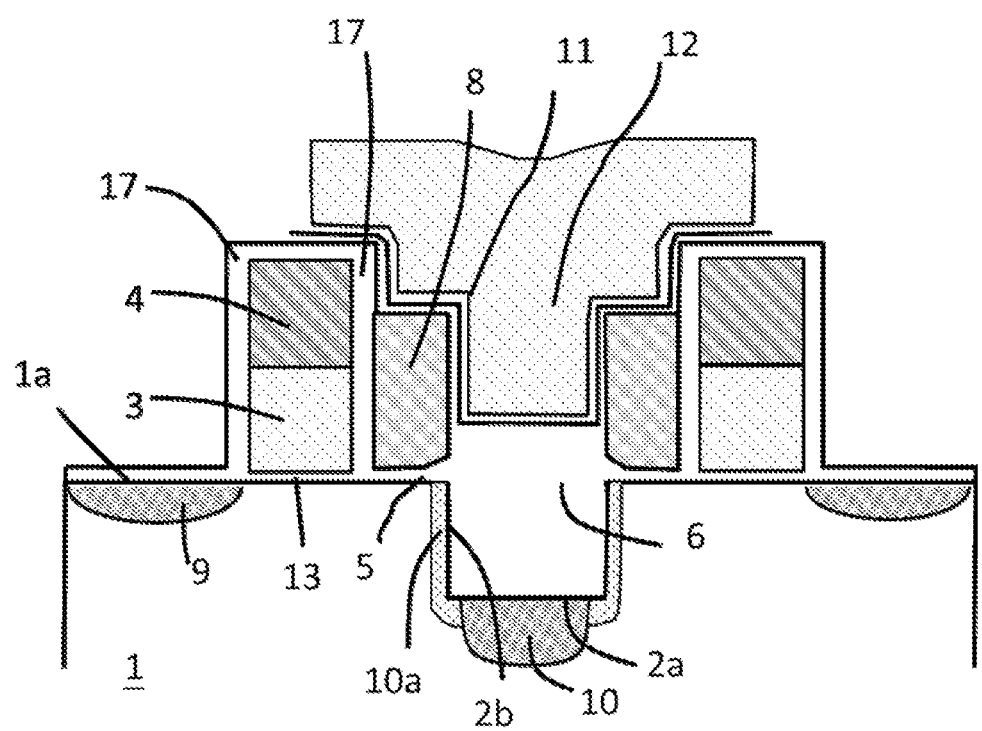
FIG. 6j is a diagrammatic cross sectional view of a final product of a low electric field source erasable non-volatile memory unit of the second embodiment according to the present invention.

As shown in FIG. 6i, an oxide/nitride/oxide (ONO) dielectric layer is formed and serves as a second dielectric layer 11 having a thickness of 10-20 nm, preferably 15 nm. A control gate 12 is formed on the second dielectric layer 11. For example, a polycrystalline silicon layer is formed on the whole face of the second dielectric layer 11 and has a thickness of 100 nm. Next, another etch blocking pattern layer is formed, and selective etching is carried out. The remaining polycrystalline silicon layer defines a control gate 12. The control gate 12 mainly covers the floating gate 8. Then, the etch blocking pattern layer is removed. The main structure of the low electric field source erasable non-volatile memory unit is accomplished by now, and its cross sectional view is shown in FIG. 6i which is identical to FIG. 5.

Operation of the low electric field source erasable non-volatile memory unit according to the present invention will now be set forth.

During the erasing operation, i.e., when the low electric field source erasable non-volatile memory unit undergoes the operation of writing "1", a voltage of 6V is applied to the source diffusion region 10, a voltage of −9V is applied to the control gate 12, and a voltage of 0V is applied to the drain diffusion region 9 and the select gate 3. Since an equivalent capacitor exists between the floating gate 8 and the control gate 12, the capacitance of the equivalent capacitor is far larger than the capacitance of an equivalent capacitor between the floating gate 8 and the source diffusion region 10. Thus, most of a voltage difference applied between the control gate 12 and the source diffusion region 10 will be reflected on the voltage difference between the floating gate 8 and the source diffusion region 10. Namely, the voltage of the floating gate 8 is about −8V. According to the principle of Fowler-Nordheim tunneling, the electrons will tunnel through the tunnel dielectric layer 5 at the bottom of the floating gate 8 into the source diffusion region 10, and the final equivalent polarity of the floating gate 8 is positive.

Since the voltage difference between the source diffusion region 10 and the control gate 12 is as high as 14V and since the source diffusion region 10 has a higher voltage, band-to-band tunneling (or referred to as gate-induced drain leakage (GIDL)) is triggered, leading to a breakdown voltage between the source diffusion region 10 and the p-typed silicon substrate 1. The magnitude of the leakage current depends on the electric field intensity between the source diffusion region 10 and the p-typed silicon substrate 1. In the low electric field source erasable non-volatile memory unit according to the present invention, since the source diffusion region 10 has a larger space extending in the transverse direction and forms a lightly-doped source, the electric field intensity can effectively be reduced to greatly reduce the magnitude of the leakage current, increasing the utility efficiency of the power source and reducing the temperature increase during operation of the circuit. The service life of the circuit is, thus, prolonged.

During the operation of writing "0", a voltage of 5-6V is applied to the source diffusion region 10, a voltage of 9V is applied to the control gate 12, a voltage of 0-0.5V is applied to the drain diffusion region 9, and a voltage of about 1V is applied to the select gate 3. The voltage of 1V is slightly higher than the threshold voltage of an equivalent transistor component of the low electric field source erasable non-volatile memory unit, such that the equivalent transistor component is in a conductive state. This conductive state causes the equivalent transistor component of the low electric field source erasable non-volatile memory unit to conduct a micro ampere (μA) current. This current flows from the source diffusion region 10, flows in the p-type silicon substrate 1 along the channel portion of the tunnel dielectric layer 5, takes a quarter turn at below the first dielectric layer 13, and flows into the drain diffusion region 9 via the channel portion below the select gate 3. The electrons flow in a reverse direction opposite to the current. In this case, the floating gate is in a state having a higher voltage due to the bias of the control gate 12, such that the tunnel dielectric layer 5 below the floating gate 8 is also in a state having a higher voltage. However, the voltage at the channel portion below the first dielectric layer 13 is lower due to the conductive state of the equivalent transistor component. Thus, when the electrons flow through the channel portion below the first dielectric layer 13 into the channel portion of the tunnel dielectric layer 5, the corresponding voltage change (about 5V) creates a high electric field which triggers the mechanism of hot electron injection. Most of the electrons will flow from the high electric field through the tunnel dielectric layer 5 (tunneling) into the floating gate 8. Finally, the equivalent polarity of the floating gate 8 turns into negative after the floating gate 8 has trapped a sufficient amount of electrons.

During reading operation, a voltage of 0V is applied to the source diffusion region 10 and the control gate 12 (or a voltage of Vcc is applied to the control gate 12, Vcc is the power supply voltage of the memory circuit and is generally 1.8V in a 0.18 μm process), a voltage of about 1V is applied to the drain diffusion region 9, and a voltage of Vcc is applied to the select gate 3. In this case, the channel portion below the select gate 3 is in a conductive state. Assume that the storage state of the low electric field source erasable non-volatile memory unit is "0" (namely, the polarity of the floating gate 8 is negative), the channel portion of the tunnel dielectric layer 5 below the floating gate 8 is not in the conductive state (namely, the magnitude of the current in the channel portion is almost 0). On the other hand, assume that the storage state of the low electric field source erasable non-volatile memory unit is "1" (namely, the polarity of the floating gate 8 is positive), the channel portion of the tunnel dielectric layer 5 below the floating gate 8 is also in the conductive state. In this case, a current of about 30 μA exists in the channel. The storage content in the low electric field source erasable non-volatile memory unit can be known by detecting the magnitude of the current in the channel.

Thus since the illustrative embodiments disclosed herein may be embodied in other specific forms without departing from the spirit or general characteristics thereof, some of which forms have been indicated, the embodiments described herein are to be considered in all respects illustrative and not restrictive. The scope is to be indicated by the appended claims, rather than by the foregoing description, and all changes which come within the meaning and range of equivalency of the claims are intended to be embraced therein.

The invention claimed is:

1. A low electric field source erasable non-volatile memory unit comprising:
   a substrate including an upper surface, with the substrate further including a source diffusion region and a drain diffusion region, with the source diffusion region including a heavily-doped region and a lightly-doped region extending outwards from the heavily-doped region, the heavily-doped region has a first width, wherein the lightly-doped region of the source diffusion region is formed on a groove portion defined inside the substrate and under the upper surface of the substrate and the lightly-doped region is formed on a sidewall of the groove portion, the sidewall of the groove portion is connected to the upper surface of the substrate, and the heavily-doped region is formed under the groove portion;
   a first dielectric layer formed on the upper surface of the substrate and located on the drain diffusion region side;
   a tunnel dielectric layer formed on the upper surface of the substrate and located on the source diffusion region side, the tunnel dielectric layer being thicker than the first dielectric layer;
   a source insulating layer formed on the upper surface of the substrate, the source insulating layer being thicker than the tunnel dielectric layer;
   a select gate formed on the first dielectric layer;
   a floating gate formed on a face of the tunnel dielectric layer, with the floating gate partially overlapped with the lightly-doped region of the source diffusion region and misaligned from the heavily-doped region of the source diffusion region by a distance;
   a second dielectric layer formed on a face of the floating gate; and
   a control gate formed on the face of the floating gate and covering the heavily-doped region and at least partially the lightly-doped region, with the control gate and the floating gate being insulating to each other by the second dielectric layer, the control gate having a second width greater than the first width of the heavily-doped region.

2. The low electric field source erasable non-volatile memory unit as claimed in claim 1, wherein the distance of the floating gate misaligned from the heavily-doped region of the source diffusion region is in a horizontal direction or a vertical direction.

3. The low electric field source erasable non-volatile memory unit as claimed in claim 1, wherein the first dielectric layer has a thickness of 0.5-10 nm.

4. The low electric field source erasable non-volatile memory unit as claimed in claim 1, wherein the tunnel dielectric layer has a thickness of 5-15 nm.

5. A method for producing a low electric field source erasable non-volatile memory unit, comprising:
   providing a substrate, with the substrate including an upper surface;
   forming a first dielectric layer on the upper surface of the substrate;
   forming a select gate on the first dielectric layer;
   forming a select gate sidewall insulating layer, and forming a tunnel dielectric layer on the upper surface of the substrate at a location not covered by the select gate, the tunnel dielectric layer being thicker than the first dielectric layer;
   forming a self-aligned floating gate;
   forming a lightly-doped region of a source diffusion region by ion implantation;
   forming an ion implantation barrier layer;
   forming a heavily-doped region of the source diffusion region by ion implantation, the heavily-doped region having a first width;
   removing the ion implantation barrier layer, wherein the lightly-doped region of the source diffusion region is formed on a groove portion defined inside the substrate and under the upper surface of the substrate and the lightly-doped region is formed on a sidewall of the groove portion, the sidewall of the groove portion is connected to the upper surface of the substrate, and the heavily-doped region is formed under the groove portion;
   repairing ion implantation defects caused by heavily-doped region by silicon oxidation and forming a source insulating layer, the source insulation layer being thicker than the tunnel dielectric layer;
   forming a second dielectric layer on the floating gate; and
   forming a control gate on the second dielectric layer, the control gate covering the heavily-doped region and at least partially the lightly-doped region, the control gate having a second width greater than the first width of the heavily-doped region.

6. The method for producing a low electric field source erasable non-volatile memory unit as claimed in claim 5, wherein the heavily-doped region and the lightly-doped region of the source diffusion region include phosphorus atoms and arsenic atoms having different diffusion coefficients.

7. The method for producing a low electric field source erasable non-volatile memory unit as claimed in claim 5, wherein the ion implantation barrier layer has a thickness of 10-30 nm.

8. The method for producing a low electric field source erasable non-volatile memory unit as claimed in claim 5, wherein the tunnel dielectric layer has a thickness of 5-15 nm.

9. The method for producing a low electric field source erasable non-volatile memory unit as claimed in claim 5, wherein the source insulating layer has a thickness of 10-30 nm.

10. A method for producing a low electric field source erasable non-volatile memory unit, comprising:
    providing a substrate, with the substrate including an upper surface;
    forming a first dielectric layer on the upper surface of the substrate;
    forming a select gate on the first dielectric layer;
    forming a select gate sidewall insulating layer, and forming a tunnel dielectric layer on the upper surface of the substrate at a location not covered by the select gate, the tunnel dielectric layer being thicker than the first dielectric layer;
    forming a self-aligned floating gate;
    forming a self-aligned groove structure;
    forming an ion implantation barrier layer;
    forming a heavily-doped region and a lightly-doped region of a source diffusion region by inclined ion implantation and vertical ion implantation, the heavily-doped region having a first width, wherein the lightly-doped region of the source diffusion region is formed on a groove portion defined inside the substrate and under the upper surface of the substrate and the lightly-doped region is formed on a sidewall of the groove portion, the sidewall of the groove portion is connected to the upper surface of the substrate, and the heavily-doped region is formed under the groove portion;
    repairing ion implantation defects caused by heavily-doped region by silicon oxidation and forming a source insulating layer, the source insulating layer being thicker than the tunnel dielectric layer;
    removing the ion implantation barrier layer;
    filling a portion of the groove structure by a flat insulating layer;
    forming a second dielectric layer on the floating gate and the flat insulating layer; and
    forming a control gate on the second dielectric layer, the control gate covering the heavily-doped region and at least partially the lightly-doped region, the control gate having a second width greater than the first width of the heavily-doped region.

11. The method for producing a low electric field source erasable non-volatile memory unit as claimed in claim 10, wherein the heavily-doped region and the lightly-doped region of the source diffusion region include phosphorus atoms and arsenic atoms having different diffusion coefficients.

12. The method for producing a low electric field source erasable non-volatile memory unit as claimed in claim 10, wherein the ion implantation barrier layer has a thickness of 2-20 nm.

13. The method for producing a low electric field source erasable non-volatile memory unit as claimed in claim 10, wherein the tunnel dielectric layer has a thickness of 5-15 nm.

14. The method for producing a low electric field source erasable non-volatile memory unit as claimed in claim 10, wherein the source insulating layer has a thickness of 10-30 nm.

15. The method for producing a low electric field source erasable non-volatile memory unit as claimed in claim 10, wherein forming a heavily-doped region and a lightly-doped region of a source diffusion region further comprising forming the heavily-doped region and the lightly-doped region inside the substrate with the heavily-doped region and the lightly-doped region formed under the upper surface of the substrate.

* * * * *